United States Patent
Shrivastav et al.

(10) Patent No.: US 7,574,344 B2
(45) Date of Patent: Aug. 11, 2009

(54) STATIC TIMING BASED IR DROP ANALYSIS

(75) Inventors: Gaurav Shrivastav, Sunnyvale, CA (US); Stimit K. Oak, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 561 days.

(21) Appl. No.: 11/240,137

(22) Filed: Sep. 29, 2005

(65) Prior Publication Data
US 2007/0069736 A1    Mar. 29, 2007

(51) Int. Cl.
G06F 17/50    (2006.01)
(52) U.S. Cl. .............................. 703/14; 703/22; 702/64; 716/6
(58) Field of Classification Search .................. 703/14, 703/20; 702/77, 57; 714/48; 716/6, 5, 4, 716/10
See application file for complete search history.

(56) References Cited

U.S. PATENT DOCUMENTS

2002/0045995 A1*  4/2002  Shimazaki et al. ............ 702/77
2003/0125923 A1*  7/2003  Grochowski et al. .......... 703/20
2004/0163018 A1*  8/2004  Yoshida ........................ 714/48
2005/0028119 A1*  2/2005  Frenkil .......................... 716/6
2006/0026540 A1*  2/2006  Bhooshan et al. .............. 716/4
2006/0031795 A1*  2/2006  Rahmat et al. ................. 716/5
2006/0229828 A1* 10/2006  Hathaway et al. ............. 702/57
2006/0265681 A1* 11/2006  Bakir et al. ................... 716/10

* cited by examiner

*Primary Examiner*—Paul L Rodriguez
*Assistant Examiner*—Kandasamy Thangavelu
(74) *Attorney, Agent, or Firm*—Martine Penilla & Gencarella, LLP

(57) ABSTRACT

A method for determining a maximum IR drop on a power grid of a circuit is disclosed. The method includes dividing a reference timing signal into multiple bins. Each one of the bins having a corresponding bin duration. The bins being divided by a corresponding fuzzy boundaries. Each one of the fuzzy boundaries having a corresponding boundary duration. Each one of the of bins is analyzed including selecting one of the bins, identifying a first set devices that transition to their corresponding maximum current states during the selected bin and identifying a second set of devices that transition to their corresponding maximum current states during at least one of the boundaries of the selected bin, but not within the selected bin. A maximum current demand equal to a sum of the maximum current states of the first and second plurality of devices is calculated. A system for testing a circuit is also disclosed.

18 Claims, 7 Drawing Sheets

STATIC TIMING BASED IR DROP ANALYSIS

BACKGROUND

The present invention relates generally to testing circuit simulations, and more particularly, to methods and systems for determining resistance, voltage drops and current loads in a simulation of a semiconductor circuit.

The density of semiconductor circuits (e.g., memory, processor, ASIC, etc.) is constantly increasing. As each generation of ever-smaller semiconductor devices (e.g., transistors, gates, interconnects, etc.) has ever-smaller physical sizes, the smaller semiconductor devices are then formed on the semiconductor circuit at ever greater densities. As a result, the power consumed by the semiconductor circuit is also increasing as is the density of the power consumption. The increasing power consumption density can also be referred to as an increasing current density (i.e., more current per unit of area) of the semiconductor circuit.

As the semiconductor device sizes become smaller, the interconnecting paths conducting the electrical power and signals to and between each of the semiconductor device also become smaller. As the interconnecting paths become smaller the electrical resistance in the interconnecting paths can also increase. The combination of the increased current density and the increased resistance of the interconnecting paths can result in variations in voltage in the electrical power provided to a portion of the semiconductor circuit as the current demand for that portion varies.

Each new semiconductor circuit is typically simulated in a circuit simulation system. Among the many tests performed on the circuit simulation is an IR test. The IR test determines if the voltage in the electrical power provided to each portion of the semiconductor circuit remains within an acceptable range as the current load of the respective portions varies.

Typically the IR (e.g., current and resistance) test assumes a worst case scenario where all devices in each portion of the semiconductor circuit simulation are activated in their respective maximum current states, at the same time. The maximum possible current demand for each portion of the semiconductor circuit simulation can then be calculated. A corresponding supply interconnecting path is provided between each respective portion of the semiconductor circuit simulation and the voltage supply (e.g., VDD). As the maximum possible current demand for each portion of the semiconductor circuit simulation has been determined then the corresponding voltage drop on the corresponding supply interconnecting path can similarly be calculated.

In most semiconductor circuits, all of the devices in any one portion are not simultaneously activated in their respective maximum current states. As a result, determining the maximum possible current demand for each portion of the semiconductor circuit in the above-described manner yields substantially inaccurate IR test results. In view of the foregoing, there is a need for an improved and more accurate system and method for determining an IR test for each portion of a semiconductor circuit.

SUMMARY

Broadly speaking, the present invention fills these needs by providing an improved and more accurate system and method for determining an IR test for each portion of a semiconductor circuit. It should be appreciated that the present invention can be implemented in numerous ways, including as a process, an apparatus, a system, computer readable media, or a device. Several inventive embodiments of the present invention are described below.

One embodiment provides a method for determining a maximum IR drop on a power grid of a circuit is disclosed. The method includes dividing a reference timing signal into multiple bins. Each one of the bins has a corresponding bin duration. The bins being divided by corresponding fuzzy boundaries. Each one of the fuzzy boundaries having a corresponding boundary duration. Each one of the bins is analyzed including selecting one of the bins, identifying a first set of devices that transition to their corresponding maximum current states during the selected bin and identifying a second set of devices that transition to their corresponding maximum current states during at least one of the boundaries of the selected bin, but not within the selected bin. A maximum current demand equal to a sum of the maximum current states of the first and second plurality of devices is calculated.

The bin duration corresponding to each one of the bins can be manually selected. The bin duration corresponding to each one of the bins can have different durations. The bin duration corresponding to each one of the bins can be determined as a function of the reference timing signal. The bin duration corresponding to each one of the bins is a function of a sum of each of the devices in the first set of devices and the second set of devices. The bins can include a manually selected number of bins.

The boundary duration corresponding to each one of the fuzzy boundaries can be manually selected. The boundary duration corresponding to each one of the fuzzy boundaries can have different durations.

The first set of devices and the second set of devices are included in a first portion of the circuit. The circuit can include a simulation of a circuit.

The method can also include determining if additional bins remain to be analyzed, selecting a subsequent bin if additional bins remain to be analyzed and analyzing the subsequent bin. The calculated maximum current demand is output if no additional bins remain to be tested.

Calculating the maximum current demand for the bin can include calculating a maximum IR drop on a power grid of the circuit during the selected bin. The reference timing signal can include a clock signal.

Yet another embodiment provides a method for determining a maximum IR drop on a power grid of a circuit simulation. The method includes dividing a clock signal into multiple bins, each one of the bins having corresponding bin duration. The bin duration corresponding to each one of the bins is determined as a function of the clock signal. The bins include a manually selected number of bins. The bins being divided by corresponding fuzzy boundaries. Each one of the fuzzy boundaries having corresponding boundary duration. The boundary duration corresponding to each one of the fuzzy boundaries have different durations. Each one of the bins is analyzed including selecting one of the bins, identifying a first set of devices that transition to their corresponding maximum current states during the selected bin and identifying a second plurality of devices that transition to their corresponding maximum current states during at least one of the boundaries of the selected bin, but not within the selected bin. A maximum current demand equal to a sum of the maximum current states of the first and second sets of devices is calculated. A maximum IR drop on the power grid of the circuit simulation during the selected bin is also calculated. If additional bins remain to be analyzed then a subsequent bin is selected and analyzed. The calculated maximum current demand is output if no additional bins remain to be tested.

Yet another embodiment provides a circuit simulation system. The system includes a host computer system, a circuit simulation application and a set of circuit data stored on the host computer system. The circuit data including data that defines the circuit being simulated. A test application includes a maximum IR drop application including logic for dividing a reference timing signal into multiple bins, each one of the bins having corresponding bin duration. The bins being divided by corresponding fuzzy boundaries. Each one of the fuzzy boundaries having corresponding boundary duration. Logic for analyzing each one of the bins including logic for selecting one of the bins, logic for identifying a first set of devices that transition to their corresponding maximum current states during the selected bin and logic for identifying a second set of devices that transition to their corresponding maximum current states during at least one of the boundaries of the selected bin, but not within the selected bin. Logic for calculating a maximum current demand equal to a sum of the maximum current states of the first and second sets of devices is also included.

The system can also include logic for determining if additional bins remain to be analyzed, logic for selecting a subsequent bin if additional bins remain to be analyzed and analyzing the subsequent bin and logic for outputting the calculated maximum current demand if no additional bins remain to be tested.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for an improved and more accurate system and method for determining an IR test for each portion of a semiconductor circuit will now be described. It will be apparent to those skilled in the art that the present invention may be practiced without some or all of the specific details set forth herein.

The analysis of an electrical circuit is typically performed using a software simulation of the electrical circuit. The software simulation is cheaper and easier to test than forming an actual electrical circuit. This is especially true for semiconductor circuits. As described above, the IR test typically assume all circuit devices are in the maximum current state. This assumption results in greatly over stated IR estimates because most devices in semiconductor circuits are arranged sequentially and not in parallel nor in the form of analog circuits. By way of example, the devices in semiconductor circuits can include multiple logic blocks (e.g., gates, flip-flops, sense amplifiers, inverters, etc.) that are arranged in series. The multiple logic blocks sequentially conduct a logic signal through the series of logic blocks. Similarly, a timing signal (e.g. a clock signal) can be used to trigger when different devices change states and therefore when the different devices are in their respective maximum current states.

Figure 1:
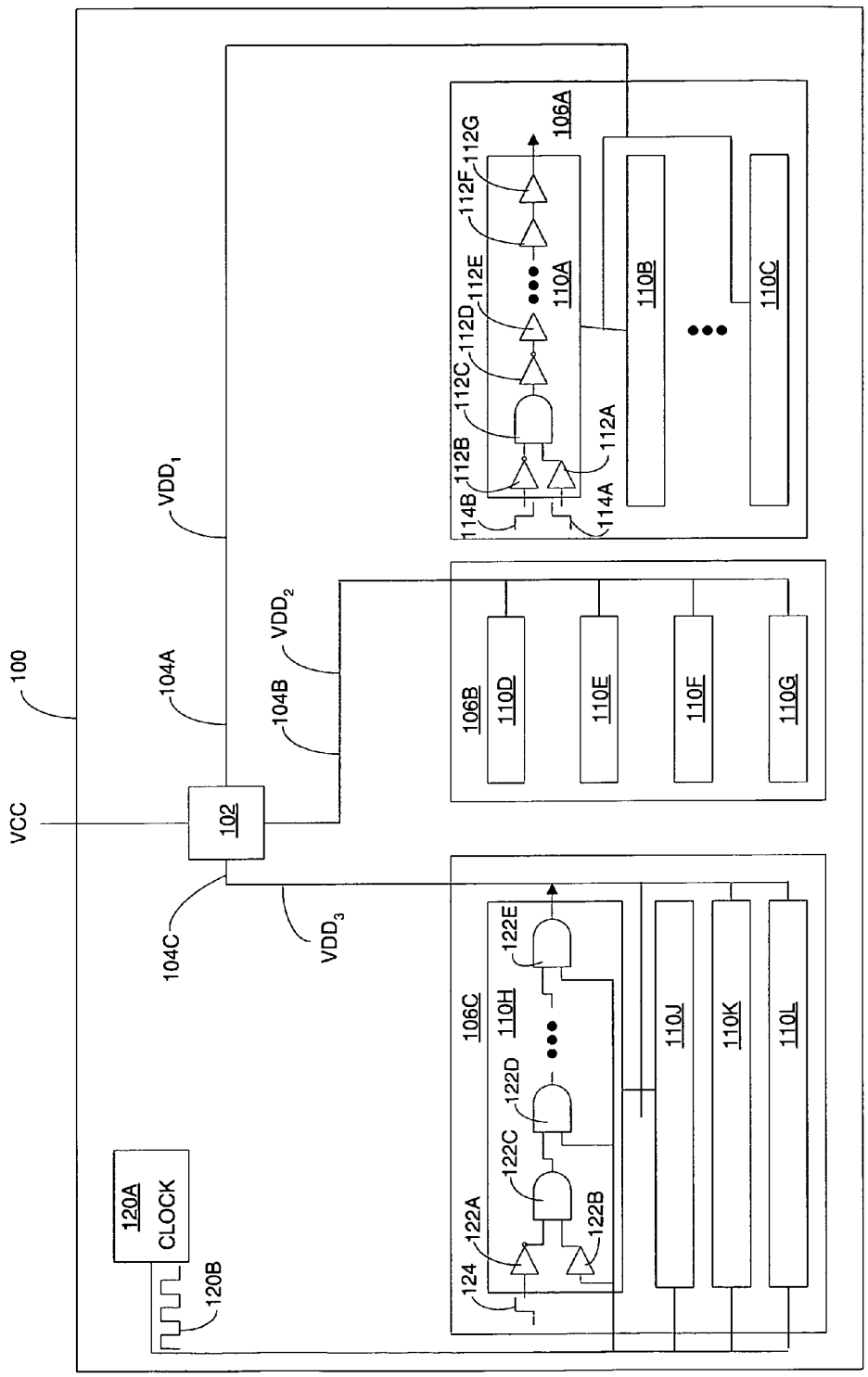
FIG. 1 is a block diagram of a semiconductor circuit, in accordance with one embodiment of the present invention.

FIG. 1 is a block diagram of a semiconductor circuit 100, in accordance with one embodiment of the present invention. The semiconductor circuit 100 includes a voltage isolation and/or divider circuit 102. Three or more supply voltages $VDD_1$, $VDD_2$ and $VDD_3$ are output from the voltage isolation and/or divider circuit 102 to respective interconnecting paths 104A-C. Interconnecting paths 104A-C are connected to respective portions 106A-C of the semiconductor circuit 100. Each of the portions 106A-C of the semiconductor circuit 100 include one or more smaller circuits 110A-L. By way of example, portion 106A includes smaller circuits 110A-C.

While the semiconductor circuit 100 is shown with only three portions 106A-C, it should be understood that the semiconductor circuit can be divided into less than or more than three portions. Similarly, while each of the portions 106A-C of the semiconductor circuit 100 are shown divided into three or four smaller circuits 110A-L, it should be understood that each of the portions can be divided less than or more than three of four smaller circuits 110A-L.

Referring now to the smaller circuit 110A, includes multiple logic blocks 112A-G. The logic blocks 112B-G are substantially coupled in series. Similarly, the logic blocks or 112A, C-G are substantially coupled in series. As logic signals 114A and 114B pass through the smaller circuit 110A, each of the logic blocks 112A-G change states sequentially and not simultaneously. By way of example, approximately one gate delay after logic signals 114A and 114B are applied to the sense amplifier 112A and the inverter 112B, respectively, then the AND gate 112C will change states. After approximately one additional gate delay after the AND gate 112C changes state, the inverter 112D can change states to conduct the logic to the sense amplifier 112E. Similarly and after subsequent gate delays, the logic signal is conducted sequentially through the remaining logic blocks 112F-G and then output from the portion 106A.

The circuit 100 can also include a clock signal source 120A. The clock signal 120B output from the clock signal source 120A can be used to trigger events (e.g., when a logical block changes state). Referring now to smaller circuit 110H that includes multiple logic blocks 122A-E. The clock signal 120B is coupled to the inputs of logical blocks 122B and 122C-E.

In operation, the AND gate 122C outputs the logic signal output from the inverter 122A approximately one gate delay after the clock signal 120B switches to a corresponding state. The logic signal 124 is similarly sequentially coupled through AND gates 122D and 122E during subsequent cycles of the clock signal 120B.

As a result, all of the devices (e.g., logic blocks 112A-112G or 112A-E) in their respective portions 106A and 106C do not all change states simultaneously. Therefore, the maximum current state each one of the logic blocks 112A-112G or 112A-E does not occur at the simultaneously. The timing of when the maximum current state each one of the logic blocks 112A-112G or 112A-E can be defined and referenced to any suitable timing reference available to the semiconductor circuit 100. By way of example, the clock signal 120B can be used as a relative timing source.

Figure 2:
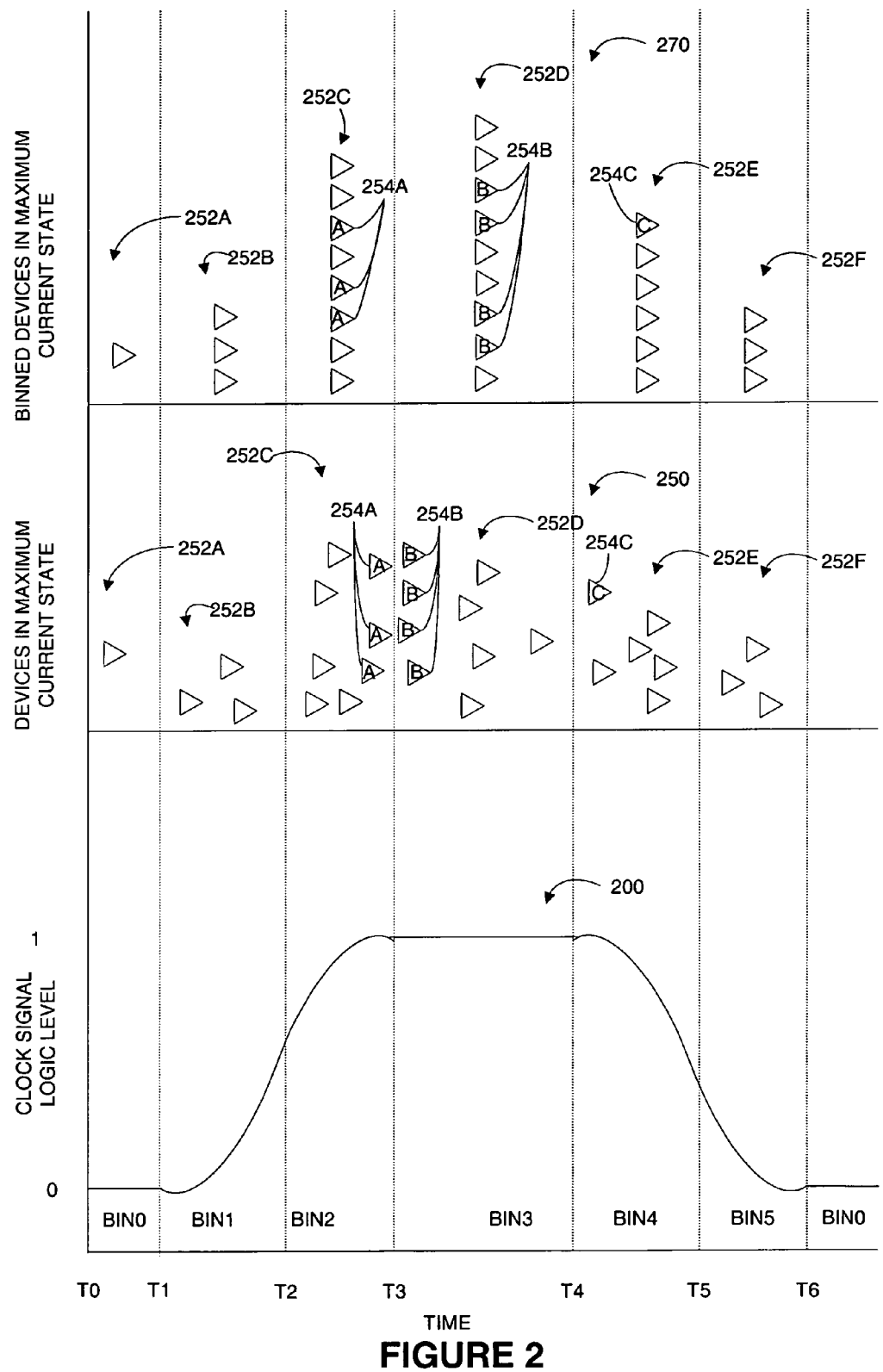
FIG. 2 is a graphical representation of a clock cycle of the clock signal and the devices in their maximum current state throughout the clock cycle for a portion of the semiconductor circuit, in accordance with an embodiment of the present invention.
Figure 3:
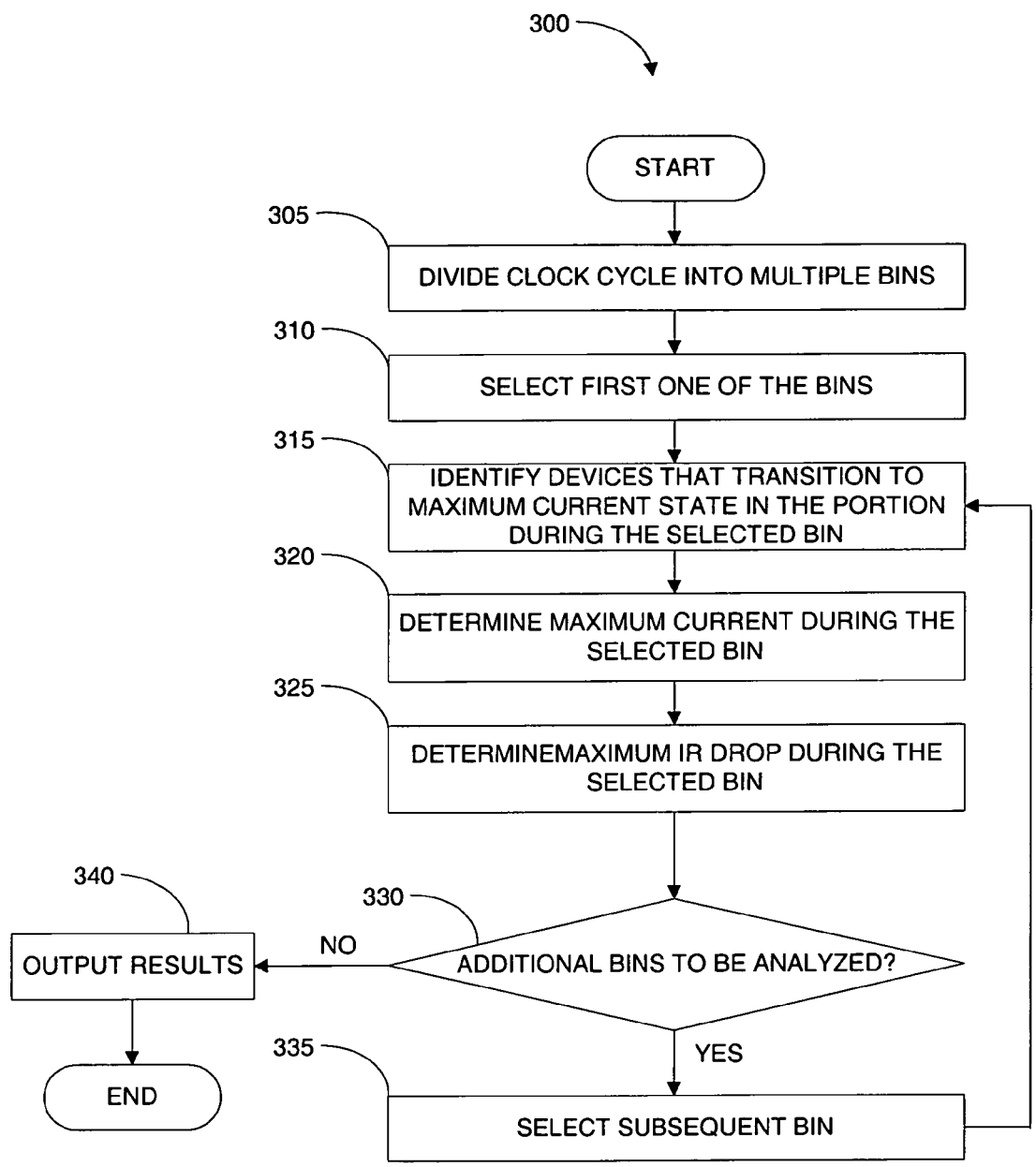
FIG. 3 is a flowchart diagram that illustrates the method operations performed in the instantaneous IR test, in accordance with one embodiment of the present invention.

FIG. 2 is a graphical representation of a clock cycle 200 of the clock signal 120B and the devices in their maximum current state throughout the clock cycle for a portion 106A of the semiconductor circuit 100, in accordance with an embodiment of the present invention. FIG. 3 is a flowchart diagram that illustrates the method operations 300 performed in the instantaneous IR test, in accordance with one embodiment of the present invention. In an operation 305, the clock cycle 200 is divided into multiple time segments or bins bin0-5. The clock cycle 200 can be divided into as many or few bins as desired. Each of the bin0-5 can have the same duration or different duration. As shown, the bin0-5 have different durations.

By way of example, bin1 has a longer duration than bin2 and bin3 has a longer duration than bin1. The different durations and different numbers of the bin0-5 can be selected to provide a desired number of data points for the subsequent analysis. By way of example, if more devices transition to their maximum current state in a first time duration, then it may be preferable to divide the first time duration into multiple bins.

The sizing of the bin0-5 is determined by the desired accuracy of the result and the available computation time. For faster computation results, the bin size can be increased. By way of example, bin0 and bin3 do not include the clock rising and falling transitions and can therefore have longer durations than the bin1, bin2, bin4 and bin5 that do include at least part of the clock rising and falling transitions. The smaller bin sizes near the clock transitions can provide more accuracy.

In an operation 310, one of the bin0-5 is selected. In an operation 315, the selected one of the bin0-5 is analyzed to identify which of the devices 252A-F and 254A-B that are predicted to transition to their respective maximum current states in the selected bin.

In an operation 320, the IR test of portion 106A can be performed for the selected bin0-5 to determine the maximum current load during the selected bin. The current demand is limited to only those devices that are conducting during a selected bin0-5. By way of example, during bin2 about eight devices 252C and 254A transition to their maximum current states. As shown in graph 250, the devices 252C and 254A are somewhat distributed in time according to the projected time within bin2 that the devices 252C and 254A will transition to their respective maximum current states. As shown in the graph 270, all of the devices 252C and 254A are shown to transition to their maximum current states within bin2 are assumed to transition to their respective maximum current states at the same time.

The current in each device can also be determined with statically obtained currents (I=k×IDsat where k is a current scaling factor). The current in each device can be nonlinear and dependent on the voltage at the device's input node. To simplify the analysis, the device current is calculated by simulating a sub circuit consisting of the active device, the output load and feeding the input with a selected slew rate. Full rail supply voltage is supplied to the device. This results in a small overestimation of the peak current but obviates the need for an iterative analysis.

Figure 4:
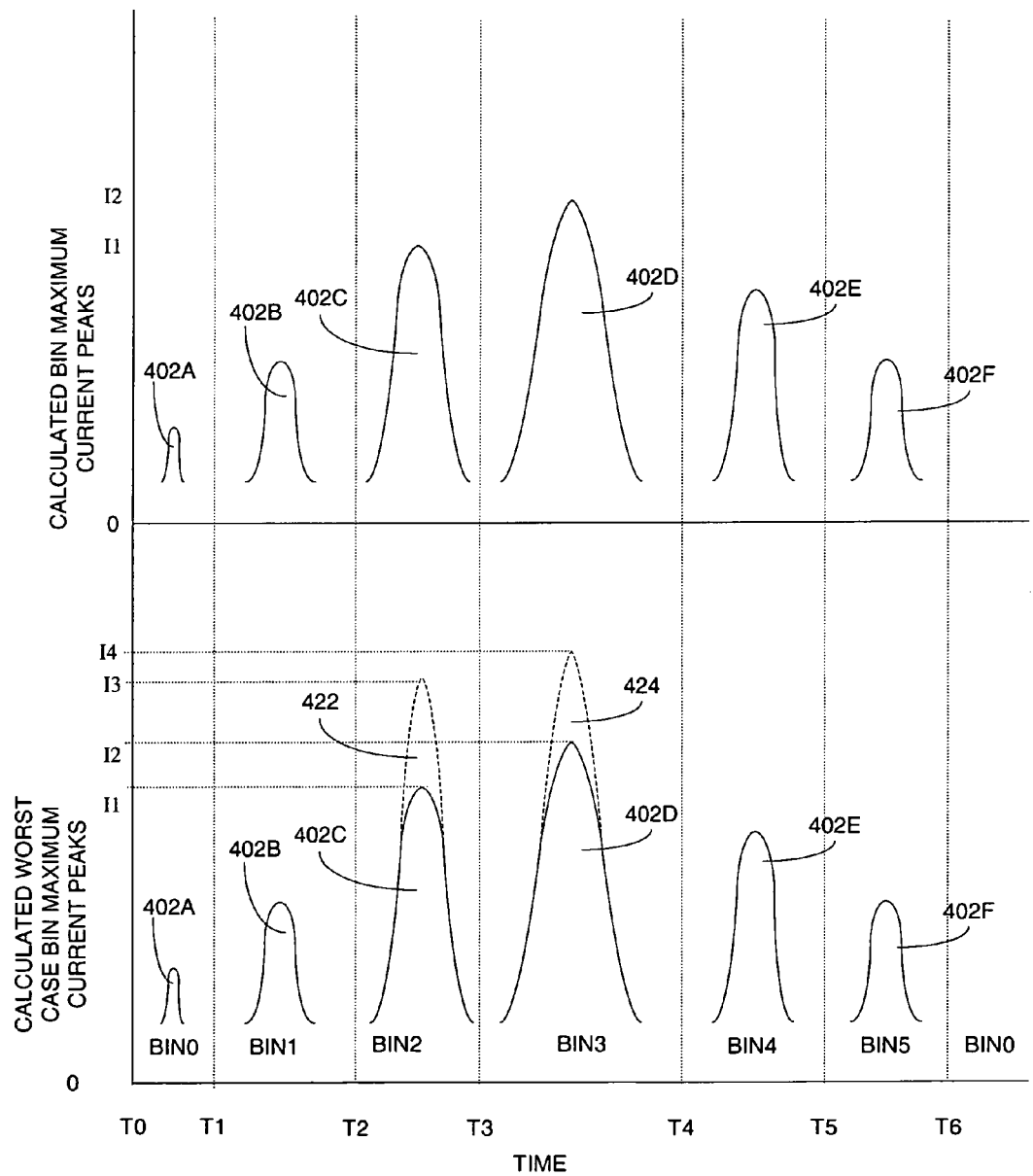
FIG. 4 is a graphical representation of the calculated maximum currents of the devices and in their respective bins, in accordance with an embodiment of the present invention.

FIG. 4 is a graphical representation of the calculated maximum currents 402A-F of the devices 252A-F and 254A-C in their respective bin0-5, in accordance with an embodiment of the present invention. Continuing the example above regarding bin2, the instantaneous IR test for bin2 would determine the sum of the maximum current demand 402C of all eight devices 252C and 254A at the same time. The sum of the maximum current demand of all eight devices 252C and 254A is the current demand 402C assigned to bin2.

In an operation 325, the corresponding voltage (i.e., IR) drop on the bin2 respective interconnecting paths 104A-C is determined. As will be described below, in subsequent iterations of operations 320 and 325, the maximum currents and IR drops will be calculated for each on the bin0-5. It should be understood that operations 320 and 325 for can be conducted in parallel for all of bin0-5 thus substantially reducing computation run time. Since the power grid (e.g., interconnecting paths 104A-C shown in FIG. 1) consists of linear RC grid elements, the power grid can be simulated using a fast linear solver. The results of all analyses can be combined to obtain a graphical representation of an absolute worst case IR drop at each input or output in the power grid.

Referring again to FIG. 3, in an operation 330, it is determined whether any of bin0-5 have yet to be analyzed. If in operation 330 any of bin0-5 have yet to be analyzed then the method operations continue in an operation 335. In operation 335, the subsequent bin is selected and the method operations continue in operation 315 above.

If in operation 330, all of bin0-5 have been analyzed then the method operations continue in an operation 340. In operation 340, the results of the instantaneous IR test can be output and the method operations can end.

In contrast, the prior art IR test ignored the actual timing of maximum current states for the devices 252A-F and 254A-C in the portion 106A and assumed that 100% of the devices (e.g., all of devices 252A-F and 254A-C) were in their respective maximum current states for all time duration of the bin0-5. Therefore, if each of the devices 252A-F and 254A-C has the same maximum current flow, then the prior art IR test would assume 100% current flow for bin1 where the instantaneous IR test described in FIGS. 2 and 3 above would identify only 10% current flow for bin1. Similarly, the instantaneous IR test described in FIGS. 2 and 3 above would identify only approximately 3% current flow for bin0, only approximately 10% current flow for bin5, only approximately 25% current flow for bin and bin3 and only approximately 20% current flow for bin4. The result of the instantaneous IR test of portion 106A will therefore provide more accurate results than the prior art IR test process.

However, the instantaneous IR test process 300 may miscalculate a worst case instantaneous peak current and the resulting IR drop. By way of example, if for any reason the time that a particular device transitions to its respective maximum current state is slightly delayed or advanced from the predicted time, then the maximum current state for the device could shift into a respective subsequent or previous bin. As a result, the actual maximum current flow in the respective subsequent or previous bin would exceed the calculated maximum current flow determined by the instantaneous IR test.

Referring again to FIG. 2, devices 254A and 254B are very close to time T3, the trailing edge of bin2 and the leading edge of bin3, respectively. Similarly device 254C is very close to time T4. If one or more of devices 254A is actually slightly delayed (i.e., a delayed device) in transitioning to its respective maximum current state, then the delayed device could shift from bin2 into bin3, causing the maximum current calculated for bin3, in operation 320 above, to be an underestimate. Similarly, the delayed device could cause the actual IR drop in bin3 to be greater than calculated in operation 325 above. Referring again to FIG. 4, the delayed device could cause the actual maximum current for bin3 to be the dashed peak 424, rather than the peak 402D calculated in operation 320.

Referring again to FIG. 2, if one or more of devices 254B is actually slightly advanced (i.e., an advanced device) in transitioning to its respective maximum current state, then the advanced device could shift from bin3 into bin2, causing the calculated maximum current in bin2 to be an underestimate. Similarly, the advanced device could cause the actual IR drop in bin2 to be greater than calculated in FIG. 3 above. Referring again to FIG. 4, the advanced device could cause the actual maximum current for bin2 to be the dashed peak 422, rather than the peak 402C calculated in operation 320.

One or more of devices 254A-C can advance or delay for many reasons. By way of example, the devices 254A-C can advance or delay due to slight variations in timing of the clock signal, variations in timing of the incoming logic signals, variations in the temperature of the devices 254A-C, physical changes to the devices 254A-C over time, variations in the semiconductor manufacturing processes that result in devices that transition slightly faster or slower, variations in bias voltages and/or current and any other cause that can vary the timing of the transitioning of the devices 254A-C. It should be understood that any combination of any one or more of the above stated cases can also cause one or more of the devices 254A-C to be slightly delayed or advanced.

An improved IR test can calculate the worst case local and global instantaneous peak currents and IR drops while also ensuring that the results are not optimistic (e.g., as described in FIGS. 2 and 3 above). The improved IR test considers substantially any possible time, relative to a timing reference signal (e.g., a clock signal 120B), that a maximum current event can occur. Based on this information, all devices that transition to their maximum current states are assigned to their respective bins. A device can be grouped into multiple bins if the device can possibly transition at several different times (e.g., advanced device or delayed device). Additionally, the boundaries between the bins can be fuzzy to ensure pessimism and account for possible variations in transition times.

The current transition times and maximum values for each device are determined as described above in FIGS. 2-3. Within each bin, the same logical exclusivity as described in more detail below can be utilized. Since the improved IR test is layout based and maintains pessimism, the integrity of the power grid can be maintained throughout the entire semiconductor circuit 100.

The exact switching time for each signal can be used along with the instantaneous IR test to calculate the IR drops across the semiconductor circuit 100. However, this makes the analysis very complicated. In addition, it does not take into account inaccuracies in signal timing which can arise from inexact timing models, process variations and signal slews. To account for these the entire clock period is divided into a user defined number of bins. Each bin contains the devices that transition within the bin interval and the current in the entire bin will be the sum of the peak currents of the devices. Additionally, this also enables the IR drop solvers to run in parallel for each bin. In the case when the static timing data shows that a device transition to maximum current state can occur at multiple times in the clock cycle the device placed in all the bins in whose time interval the transition can occur.

One issue with binning is that two devices (e.g., devices 254A, 254B in FIG. 2) having very similar transitions times to maximum current state can be placed in separate bins (e.g., bin2 for devices 254A and bin3 for devices 254B). This means that the currents in the analysis may not accurately reflect the actual conditions as summarized in FIG. 4 above. To prevent this, a selected amount of fuzziness is introduced at the boundaries (e.g., T1, T2, T3, T4, T5, T6) of the respective bin0-5. If two (or more) devices transition to their respective maximum current states close enough on either side of a bin boundary, then the devices will be placed in both the bins for the current and IR drop analyses of the respective bins. The amount of fuzziness (i.e., width or duration) of the boundaries T1, T2, T3, T4, T5, T6 can be manually selected. Further, the amount of fuzziness selected for the bin boundaries T1, T2, T3, T4, T5, T6 can be the same or different for each of the bin boundaries. By way of example, the amount of fuzziness selected for bin boundaries T2 and T5 may be greater than the amount of fuzziness selected for the bin boundaries T1, T3, T4 and T6. By way of example, bin boundaries T2 and T5 may have greater fuzziness than bin boundaries T1, T3, T4 and T6 because bin boundaries T2 and T5 occur during the transitions of the clock signal. Alternatively, bin boundaries T2 and T5 may have greater fuzziness than bin boundaries T1, T3, T4 and T6 due to projected clock signal 120B skew or other variations in the clock signal.

Figure 5:
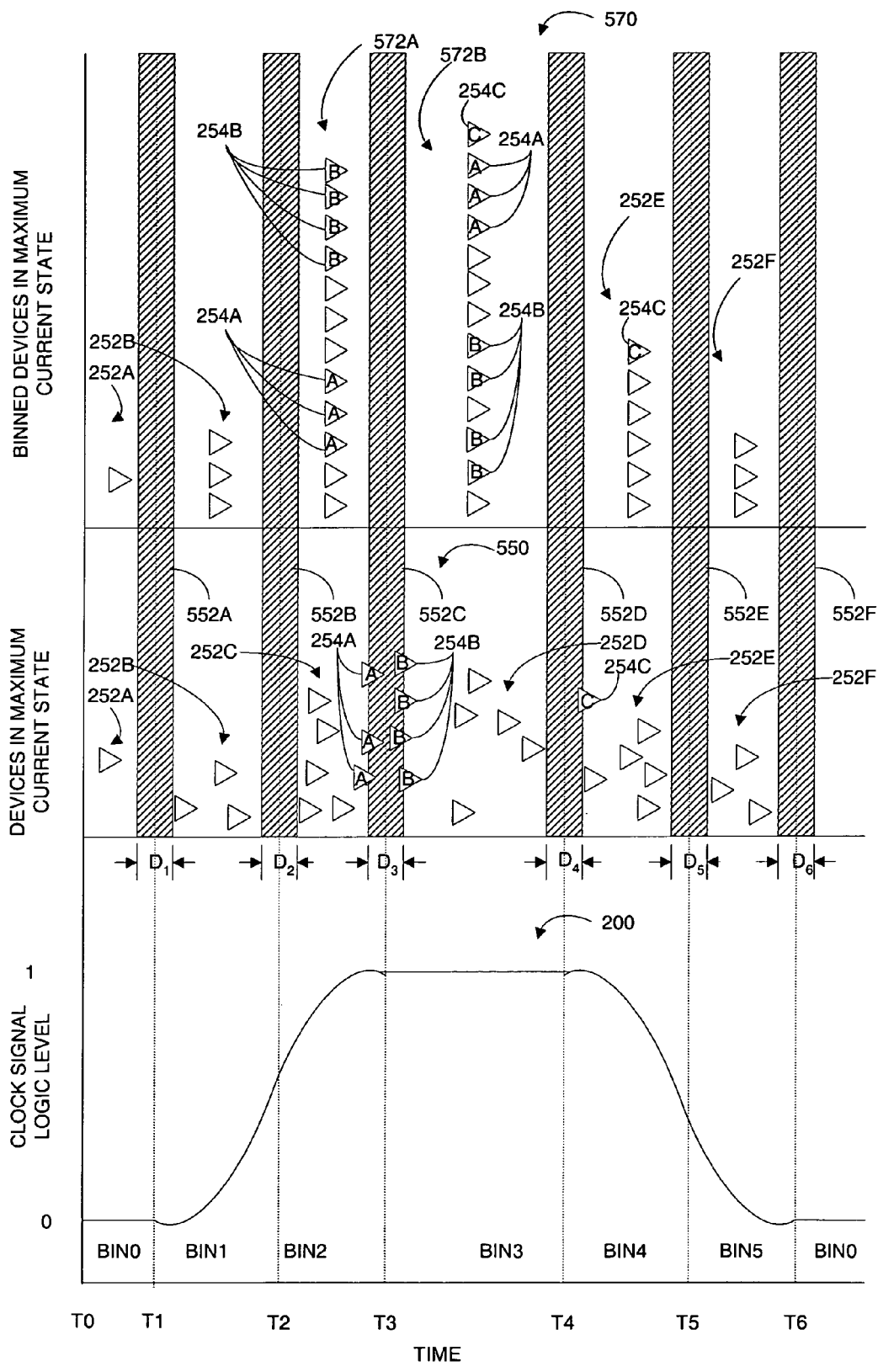
FIG. 5 is a graphical representation of a clock cycle of the clock signal and the devices in their maximum current state throughout the clock cycle for a portion of the semiconductor circuit, in accordance with an embodiment of the present invention.
Figure 6:
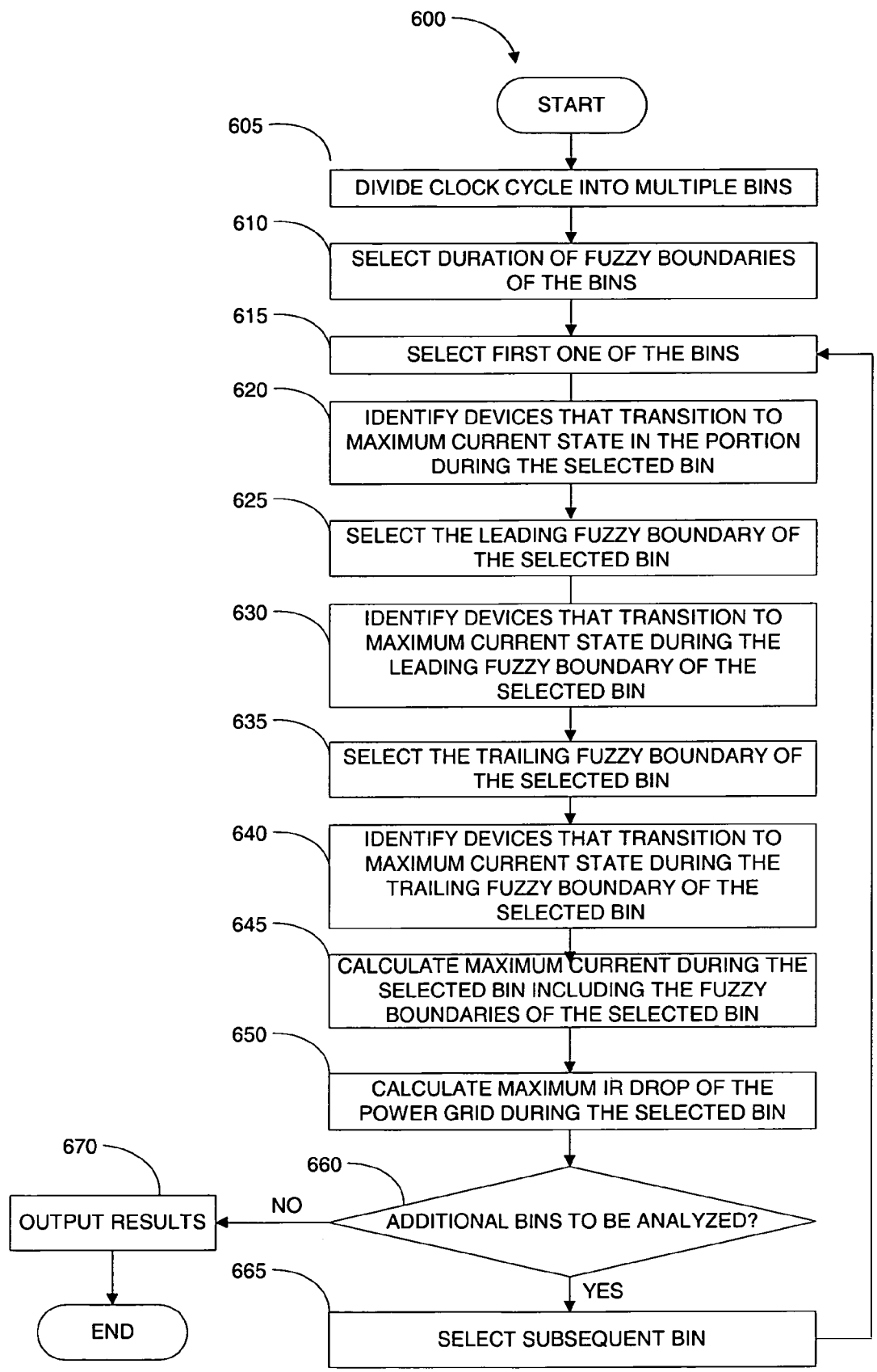
FIG. 6 is a flowchart diagram that illustrates the method operations performed in the improved IR test, in accordance with one embodiment of the present invention.

FIG. 5 is a graphical representation of a clock cycle 200 of the clock signal 120B and the devices in their maximum current state throughout the clock cycle for a portion 106A of the semiconductor circuit 100, in accordance with an embodiment of the present invention. FIG. 6 is a flowchart diagram that illustrates the method operations 600 performed in the improved IR test, in accordance with one embodiment of the present invention. In an operation 605, the clock cycle 200 is divided into multiple time segments or bins bin0-5. Each of the bin0-5 can have the same duration or different duration.

In an operation 610 the respective widths or durations D1-6 of the fuzzy boundaries T1'-6' are determined. The duration of each of the fuzzy boundaries T1'-6' can be the same or different.

In an operation 615, one of the bin0-5 is selected. In an operation 620, the selected one of the bin0-5 is analyzed to identify which of the devices 252A-F and 254A-C that are predicted to transition to their respective maximum current states in the selected bin.

In an operation 625, the leading fuzzy boundary of the selected bin is selected. In an operation 630, the leading fuzzy boundary is analyzed to determine if any devices 252A-F and 254A-C are predicted to transition to their respective maximum current states during the leading fuzzy boundary of the selected bin.

In an operation 635, the trailing fuzzy boundary of the selected bin is selected. In an operation 640, the trailing fuzzy boundary is analyzed to determine if any devices 252A-F and 254A-C are predicted to transition to their respective maximum current states during the trailing fuzzy boundary of the selected bin.

By way of example, if bin2 is selected, then the leading fuzzy boundary is T2' and the trailing fuzzy boundary is T3'. The leading fuzzy boundary T2' and the trailing fuzzy boundary T3' are reviewed to see if any of the devices 252A-F and 254A-B are predicted to transition to their respective maximum current states in the fuzzy boundaries T2' and T3'. As can be seen in FIG. 5, the transitions for devices 254A-B occur during the trailing fuzzy boundary T3'.

In an operation 645, the devices 252A-F and 254A-C that are predicted to transition to their respective maximum current states in the selected bin as determined in operation 620 above and any devices 252A-F and 254A-C that are predicted to transition to their respective maximum current states in the fuzzy boundaries as determined in operations 625-640, are assigned to the selected bin for analysis. Continuing the example of bin2's analysis, twelve devices 252C and 254A-B are assigned to bin2 for analysis. In a similar iteration analyzing bin3, thirteen devices 252D, 254B and 254C would be assigned to bin3 for analysis.

In an operation 650, the IR test of portion 106A can be performed for the selected bin0-5 to determine the maximum current load during the selected bin. Referring to FIG. 4 above, the calculated maximum current load is equal to I3, the current level of peak 422. In this manner the worst case maximum current load during bin2 can be accurately determined. In an operation 655, the corresponding voltage (i.e., IR) drop on the selected bin 0-5 (e.g., bin2) and the respective interconnecting paths 104A-C is determined.

In an operation 660, it is determined whether any of bin0-5 have yet to be analyzed. If in operation 660 any of bin0-5 have yet to be analyzed then the method operations continue in an operation 665. In operation 665, the subsequent bin is selected and the method operations continue in operation 615 above.

If in operation 660, all of bin0-5 have been analyzed then the method operations continue in an operation 670. In operation 670, the results of the improved IR test can be output and the method operations can end.

Global worst case IR drop can be determined for a uniform power grid across the entire semiconductor circuit 100. A simplification of the IR drop analysis can be made when only the maximum possible IR drop over the entire circuit 100 is needed. As the current peak would determine the worst case IR drop, and that the grid current peaks close to the rising edge of the clock. Therefore instead of considering all the possible transitions at a device or set of devices, only the transition closest to the clock edge need be tested.

Often, semiconductor circuits such as semiconductor circuit 100 of FIG. 1 above, include library cells. The library cells are typically circuit designs purchased from another party. The semiconductor circuit 100 can include many different types of library cells used in combination with non-library components to perform the desired functions. Typically, the prior art timing analysis not provide transition information for devices and sets of devices that are part of library cells. The improved IR test can simulate the devices included in the library cell independently and determine the transition times of the devices included in the library cell relative to that of the primary inputs. Thus in the top level circuit simulation, the input transition times of the devices included in the library cell can be determined.

If the internal characterized information for the library cells is not provided by the supplier of the library cells, then the devices included in the library cells can be added the respective bins which fall between the input and output signal transition times for the library cell. For flip flops, the devices on a master side of the flip flop are placed in the bins lying between the transition time of the d input and (d transition time+setup time) since the setup criteria requires that the master side has settled by the time the clock signal begins to rise. When multiple transition times are possible at the d input, the master side devices are placed in the bins that lie between each transition time and (transition time+setup). Devices in a slave side of the flip flops are placed in all bins that lie between the clock rising and output transition time.

The size of the bin0-5 determines the devices that are considered to be transitioning to their maximum current states simultaneously. However, in certain situations, some of the devices in the same bin cannot transition in the same direction simultaneously. By way of example, if a bin includes two inverters in series, then the inverters logically cannot both transition to their maximum current states at the same time. In such a case, a user defined exclusivity value can be used to analyze the mutually exclusive devices in separate analyses. Since the results for each logical group is obtained and not only the worst case, then comprehensive information on the worst IR drop at every node in the power grid is known and can be used.

Figure 7:
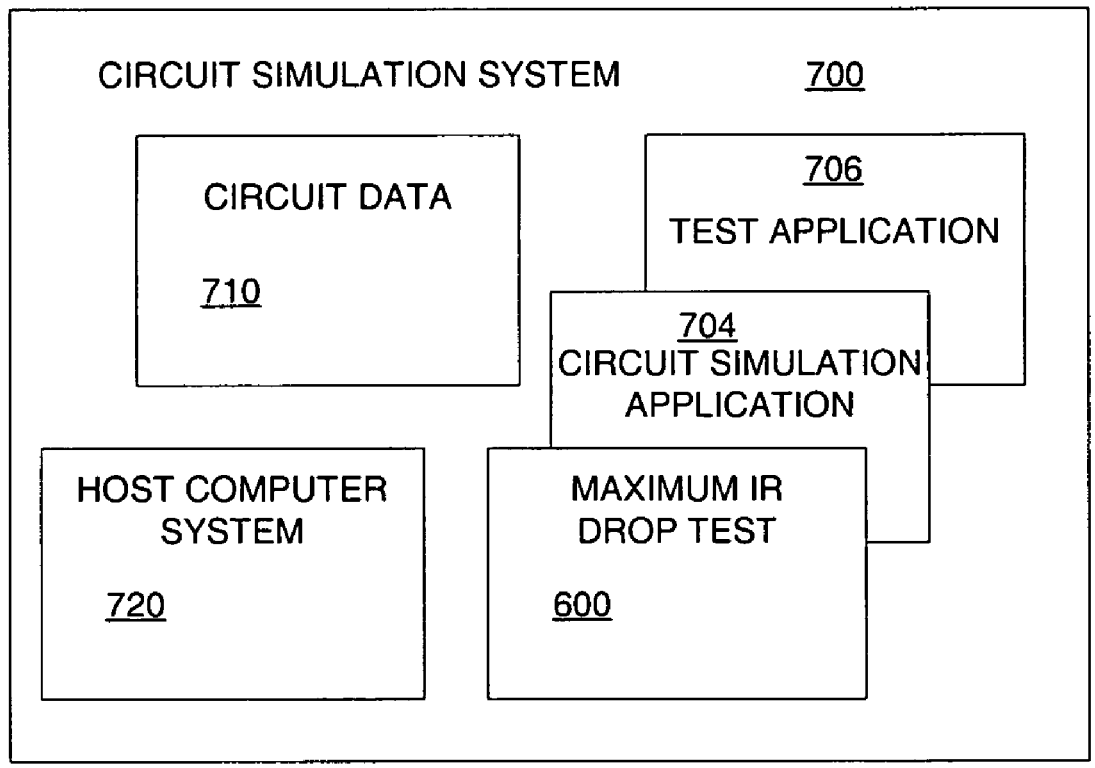
FIG. 7 is a block diagram of a circuit simulation system, in accordance with an embodiment of the present invention.

FIG. 7 is a block diagram of a circuit simulation system 700, in accordance with an embodiment of the present invention. The circuit simulation system 700 includes a host computer system 720 capable of hosting a circuit simulation and the applicable applications and data. The host computer system 720 can include a processor, display, input/output and memory systems. The host computer system 720 may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The circuit simulation system 700 also includes a circuit simulation application 704 that provides the functionality to simulate electrical circuits (e.g., semiconductor circuit 100 of FIG. 1 above). The circuit data 710 includes data defines the circuit being simulated and also includes test input and parameter data and test result data. One or more test applications 706 can also be included in the circuit simulation system 700. The test applications 706 can apply various test algorithms to the circuit simulation being hosted. One of the test applications is the improved IR test 600 as described above in FIG. 6.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for determining a maximum IR drop on a power grid of a circuit comprising:
   dividing a reference timing signal into a plurality of bins using a computer, each one of the plurality of bins having corresponding bin duration, the plurality of bins being divided by a corresponding plurality of fuzzy boundaries, each one of the plurality of fuzzy boundaries having corresponding boundary duration;
   analyzing each one of the plurality of bins using the computer including:
      selecting one of the plurality of bins;
      identifying a first plurality of devices in the circuit that transition to their corresponding maximum current states during the selected bin;
      representing the first plurality of devices in the circuit in their corresponding maximum current states;
      identifying a second plurality of devices in the circuit that transition to their corresponding maximum current states during at least one of the fuzzy boundaries of the selected bin, but not within the selected bin;
      representing the second plurality of devices in the circuit in their corresponding maximum current states;
      calculating a maximum current demand value for the selected bin equal to a sum of the maximum current states of the first plurality of devices in the circuit and the second plurality of devices in the circuit; and
      outputting the calculated maximum current value for the selected bin.

2. The method of claim 1, wherein the bin duration corresponding to each one of the plurality of bins is manually selected.

3. The method of claim 1, wherein the bin duration corresponding to each one of the plurality of bins have different durations.

4. The method of claim 1, wherein the bin duration corresponding to each one of the plurality of bins is determined by a function of the reference timing signal.

5. The method of claim 1, wherein the bin duration corresponding to each one of the plurality of bins is a function of a sum of the devices in the first plurality of devices and the second plurality of devices.

6. The method of claim 1, wherein the plurality of bins includes a manually selected number of bins.

7. The method of claim 1, wherein the boundary duration corresponding to each one of the plurality of fuzzy boundaries is manually selected.

8. The method of claim 1, wherein the boundary duration corresponding to each one of the plurality of fuzzy boundaries have different durations.

9. The method of claim 1, wherein the first plurality of devices and the second plurality of devices are included in a first portion of the circuit.

10. The method of claim 1, wherein the circuit includes a simulation of a circuit in a circuit simulation system.

11. The method of claim 1, further comprising:
    determining if additional bins remain to be analyzed; and
    selecting a subsequent bin if additional bins remain to be analyzed and analyzing the subsequent bin.

12. The method of claim 1, wherein calculating the maximum current demand for the bin includes calculating a maximum IR drop on a power grid of the circuit during the selected bin.

13. The method of claim 1, wherein the reference timing signal includes a clock signal.

14. The method of claim 1, further comprising:
    determining if additional bins remain to be analyzed;
    selecting a subsequent bin if additional bins remain to be analyzed and analyzing the subsequent bin; and
    outputting the calculated maximum current demand corresponding to each of the plurality of bins if no additional bins remain to be tested.

15. A computer implemented method for determining a maximum IR drop on a power grid of a circuit simulation comprising:
    activating the circuit simulation in a circuit simulation system on a host computer;
    dividing a clock signal into a plurality of bins using the host computer, each one of the plurality of bins having corresponding bin duration, the bin duration corresponding to each one of the plurality of bins determined as a function of the clock signal, the plurality of bins includes a manually selected number of bins, the plurality of bins being divided by a corresponding plurality of fuzzy boundaries, each one of the plurality of fuzzy boundaries having corresponding boundary duration, the boundary duration corresponding to each one of the plurality of fuzzy boundaries have different durations;
    analyzing each one of the plurality of bins using the host computer including:
       selecting one of the plurality of bins;
       identifying a first plurality of devices in the circuit that transition to their corresponding maximum current states during the selected bin;
       representing the first plurality of devices in the circuit in their corresponding maximum current states;
       identifying a second plurality of devices in the circuit that transition to their corresponding maximum current states during at least one of the fuzzy boundaries of the selected bin, but not within the selected bin;
       representing the second plurality of devices in the circuit in their corresponding maximum current states;
       calculating a maximum current demand value for the selected bin equal to a sum of the maximum current states of the first plurality of devices in the circuit and the second plurality of devices the circuit;
       calculating a maximum IR drop on the power grid of the circuit simulation during the selected bin;
       determining if additional bins remain to be analyzed;
       selecting a subsequent bin if additional bins remain to be analyzed and analyzing the subsequent bin; and
       outputting the calculated maximum current demand if no additional bins remain to be tested.

16. A circuit simulation system comprising:

a host computer system;

a circuit simulation application;

a set of circuit data stored on the host computer system, the circuit data including data that defines the circuit being simulated;

a test application including a maximum IR drop application including:

logic for dividing a reference timing signal into a plurality of bins, each one of the plurality of bins having corresponding bin duration, the plurality of bins being divided by a corresponding plurality of fuzzy boundaries, each one of the plurality of fuzzy boundaries having corresponding boundary duration;

logic for analyzing each one of the plurality of bins including:

logic for selecting one of the plurality of bins;

logic for identifying a first plurality of devices that transition to their corresponding maximum current states during the selected bin; and logic for identifying a second plurality of devices that transition to their corresponding maximum current states during at least one of the boundaries of the selected bin, but not within the selected bin; and logic for calculating a maximum current demand equal to a sum of the maximum current states of the first and second plurality of devices.

17. The system of claim 16, further comprising:

logic for determining if additional bins remain to be analyzed;

logic for selecting a subsequent bin if additional bins remain to be analyzed and analyzing the subsequent bin; and logic for outputting the calculated maximum current demand if no additional bins remain to be tested.

18. The system of claim 16, further comprising:

logic for determining if additional bins remain to be analyzed;

logic for selecting a subsequent bin if additional bins remain to be analyzed and analyzing the subsequent bin; and logic for outputting the calculated maximum current demand corresponding to each of the plurality of bins if no additional bins remain to be tested.

* * * * *